(12) United States Patent
Gotkis et al.

(10) Patent No.: US 6,929,531 B2
(45) Date of Patent: Aug. 16, 2005

(54) SYSTEM AND METHOD FOR METAL RESIDUE DETECTION AND MAPPING WITHIN A MULTI-STEP SEQUENCE

(75) Inventors: Yehiel Gotkis, Fremont, CA (US); Aleksander Owczarz, San Jose, CA (US); David Hemker, San Jose, CA (US); Nicolas Bright, San Jose, CA (US); Rodney Kistler, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/251,033

(22) Filed: Sep. 19, 2002

(65) Prior Publication Data

US 2004/0058620 A1 Mar. 25, 2004

(51) Int. Cl.⁷ .............................................. B24B 49/00
(52) U.S. Cl. ................................................. 451/8; 451/5
(58) Field of Search ............................. 451/5, 6, 8, 10, 451/11, 41; 438/692, 693

(56) References Cited

U.S. PATENT DOCUMENTS

| 4,556,845 | A | | 12/1985 | Strope et al. |
| 5,559,428 | A | | 9/1996 | Li et al. |
| 5,731,697 | A | | 3/1998 | Li et al. |
| 5,889,401 | A | | 3/1999 | Jourdain et al. |
| 6,072,313 | A | | 6/2000 | Li et al. |
| 6,093,081 | A | * | 7/2000 | Nyui et al. ................... 451/6 |
| 6,433,541 | B1 | * | 8/2002 | Lehman et al. ............. 324/230 |
| 6,558,229 | B2 | * | 5/2003 | Kimura et al. ................ 451/8 |
| 6,602,724 | B2 | * | 8/2003 | Redeker et al. ............... 438/5 |
| 6,707,540 | B1 | * | 3/2004 | Lehman et al. ............. 356/72 |
| 2002/0053904 | A1 | * | 5/2002 | Chen et al. ................. 324/230 |

FOREIGN PATENT DOCUMENTS

EP 1 201 365 5/2002

OTHER PUBLICATIONS

United States Patent Application Publication US 2002/0053904.
Patent Cooperation Treaty International Search Report.

* cited by examiner

*Primary Examiner*—Dung Van Nguyen
(74) *Attorney, Agent, or Firm*—Martine Penilla & Gencarella, LLP

(57) ABSTRACT

A system and method of measuring a metallic layer on a substrate within a multi-step substrate process includes modifying a metallic layer on the substrate such as forming a metallic layer or removing at least a portion of the metallic layer. At least one sensor is positioned a predetermined distance from the surface of the substrate. The surface of the substrate is mapped to determine a uniformity of the metallic layer on the surface of the substrate.

24 Claims, 11 Drawing Sheets

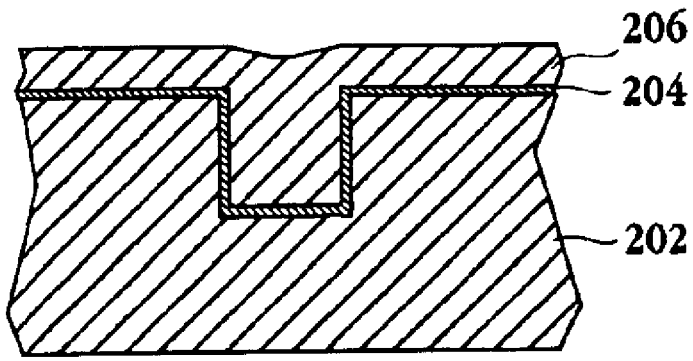
Fig. 2A *(prior art)*
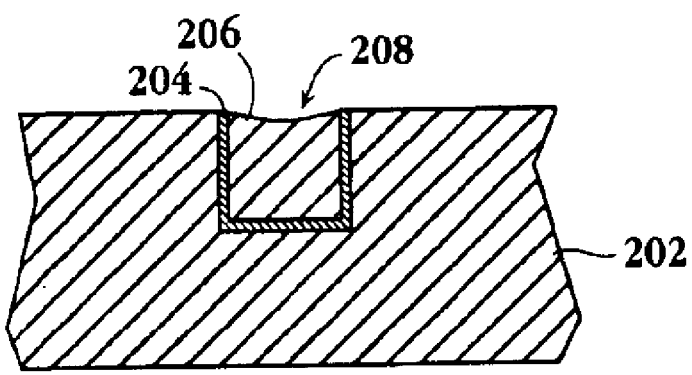
Fig. 2B *(prior art)*

SYSTEM AND METHOD FOR METAL RESIDUE DETECTION AND MAPPING WITHIN A MULTI-STEP SEQUENCE

BACKGROUND OF THE INVENTION

1. Field of the Invention

The present invention relates generally to wafer processes and equipment, and more particularly, to methods and systems for confirming a process end-point within the multi-step sequence.

2. Description of the Related Art

In the fabrication of semiconductor devices, planarization operations of silicon wafers, which can include polishing, buffing, and cleaning, are often performed. Typically, integrated circuit devices are in the form of multi-level structures on silicon substrate wafers. At the substrate level, transistor devices with diffusion regions are formed. In subsequent levels, interconnect metallization lines are patterned and electrically connected to the transistor devices to define the desired functional device. Patterned conductive layers are insulated from other conductive layers by dielectric materials, such as silicon dioxide. As more metallization levels and associated dielectric layers are formed, the need to planarize the dielectric material increases. Without planarization, fabrication of additional metallization layers becomes substantially more difficult due to the higher variations in the surface topography. In other applications, metallization line patterns are formed into the dielectric material, and then metal planarization operations are performed to remove excess metallization.

Planarizing metallization layers, specifically copper metallization layers is becoming more important as copper has begun to replace aluminum as the metal of choice for metallization processes. One method for achieving semiconductor wafer planarization is the chemical mechanical planarization (CMP) technique. Further applications include planarization of dielectric films deposited prior to the metallization process, such as dielectrics used for shallow trench isolation or for poly-metal insulation.

In general, the CMP process involves holding and rubbing a typically rotating wafer against a moving polishing pad under a controlled pressure and relative speed. CMP systems typically implement a rotating, orbital table or a linear belt in which a surface of a polishing pad is used to polish one side of a wafer. A chemical solution (i.e., slurry) is used to facilitate and enhance the CMP operation. Slurry is most usually introduced onto and distributed over a moving surface of the polishing pad as well as the surface of the semiconductor wafer being buffed, polished through, or otherwise prepared by the CMP process. The distribution of the slurry is generally accomplished by a combination of the movement of the surface of the polishing pad, the movement of the semiconductor wafer and the friction created between the semiconductor wafer and the surface of the polishing pad.

FIG. 1 shows a side view of a conventional linear wafer polishing apparatus 100. The linear wafer polishing apparatus 100 includes a polishing head and carrier 108, which secures and holds a wafer 104 in place during CMP processing. A polishing belt and pad combination 102 (polishing pad) forms a loop around rotating drums 112, and generally moves in a direction 106 at a speed of up to approximately 600 feet per minute, however this speed may vary depending upon the specific CMP operation. As the polishing pad 102 moves, the polishing head 108 rotates (either direction, as chosen by user) and lowers the wafer 104 onto the top surface (i.e., the preparation surface) of the polishing pad 102, loading it with required polishing pressure.

A bearing platen manifold assembly 110 supports the polishing pad 102 during the polishing process. The platen manifold assembly 110 may utilize any type of bearing such as a fluid bearing or an air bearing. The platen manifold assembly 110 is supported and held into place by a platen surround plate 116. Gas pressure from a gas source 114 is input through the platen manifold assembly 110 via several independently controlled of output holes that provide upward force on the polishing belt and pad combination 102 to control the profile of the polishing pad 102.

The polishing pad 102 transports slurry over the wafer surface. Typically the polishing pad 102 has longitudinal grooves 118 (i.e., grooves along the length of the polishing pad 102 in the linear direction 106 the polishing pad 102 travels around the rotating drums 112). A single slurry nozzle, or a multi nozzle dispense bar (with a number of discrete slurry dispense points) 120 dispenses the slurry 122 on the top surface of the polishing pad 102. The position of a slurry nozzle 120 can be adjusted across the width of the top surface of the polishing pad 102. The slurry nozzle 120 is typically aligned in a position relative to the wafer 104 such as center on the wafer 104. However, the position of the slurry nozzle 120 is typically adjusted to somewhat optimize the uniformity of the removal of material from the surface of the wafer 104.

FIG. 2A shows a cross-sectional view of a dielectric layer 202 on a wafer 104 that is undergoing a fabrication process that is common in constructing damascene and dual damascene interconnect metallization lines. The dielectric layer 202 has a diffusion barrier layer 204 deposited over the etch-patterned surface of the dielectric layer 202. The diffusion barrier layer, as is well known, is typically titanium nitride (TiN), tantalum (Ta), tantalum nitride (TaN) or a combination of tantalum nitride (TaN) and tantalum (Ta). Once the diffusion barrier layer 204 has been deposited to the desired thickness, a metallization layer 206 (e.g., copper layer) is formed over the diffusion barrier layer in a way that fills the etched features in the dielectric layer 202. Some excessive diffusion barrier and metallization material is also inevitably deposited over the field areas. In order to remove these overburden materials and to define the desired interconnect metallization lines and associated vias (not shown), a chemical mechanical planarization (CMP) operation is performed on the wafer 104.

There are two basic types of CMP planarization. The first type is topographical planarization, which is used to form a flat surface for a subsequent process. The second CMP type is feature shaping which is forming a flat surface that exposes features (e.g., metal features, contact, lines, vias, etched out regions and features, etc.) in layer recessions.

Determining an accurate end-point to the CMP process (end-point detection) is a very critical aspect of the CMP process. Ending the CMP process too early causes the wafer to be submitted to a re-work process to first determine the amount of additional CMP required to satisfy the desired goal (i.e., fully remove the desired quantity of material). Secondly, the wafer must be actually reworked to fully remove the desired quantity of material. If the CMP process is ended too late can result in too much material being removed resulting in dishing and rounding or even damaging the wafer beyond being salvaged by repair or rework.

Direct endpoint detection methods monitor the wafer surface using acoustic wave velocity, optical reflectance and interference, impedance/conductance, electrochemical potential change due to the introduction of specific chemical agents. U.S. Pat. Nos. 5,399,234 and 5,271,274 disclose methods of endpoint detection for metal using acoustic waves. These patents describe an approach to monitor the acoustic wave velocity propagated through the wafer/slurry to detect the metal endpoint. When there is a transition from one metal layer into another, the acoustic wave velocity changes and this has been used for the detection of endpoint.

Further, U.S. Pat. No. 6,186,865 discloses a method of endpoint detection using a sensor to monitor fluid pressure from a fluid bearing located under the polishing pad. The sensor is used to detect a change in the fluid pressure during polishing, which corresponds to a change in the shear force when polishing transitions from one material layer to the next. Unfortunately, this method is not robust to process changes. Further, the endpoint detected is global, and thus the method cannot detect a local endpoint at a specific point on the wafer surface. Moreover, the method of the U.S. Pat. No. 6,186,865 patent is restricted to a linear polisher, which requires an air bearing.

There have been many proposals to detect the endpoint using the optical reflectance from the wafer surface. These methods can be grouped into two categories: monitoring the reflected optical signal at a single wavelength using a laser source or using a broad band light source covering the full visible range of the electromagnetic spectrum. U.S. Pat. No. 5,433,651 discloses an endpoint detection method using a single wavelength in which an optical signal from a laser source is impinged on the wafer surface and the reflected signal is monitored for endpoint detection. The change in the reflectivity as the polish transfers from one metal to another is used to detect the transition.

Broadband methods typically rely on using information in multiple wavelengths of the electromagnetic spectrum. U.S. Pat. No. 6,106,662 discloses using a spectrometer to acquire an intensity spectrum of reflected light in the visible range of the optical spectrum. Two bands of wavelengths are selected in the spectra that provide good sensitivity to reflectivity change as polish transfers from one metal to another. A detection signal is then defined by computing the ratio of the average intensity in the two bands selected. Significant shifts in the detection signal indicate the transition from one metal to another.

A common problem with each of the above endpoint detection techniques is that some degree of over-polishing is required to ensure that all of the conductive material (e.g., metallization materials 206 such as copper, aluminum or other metal layers and the diffusion barrier layer 204) is removed from over the dielectric layer 202 to prevent inadvertent electrical interconnection between metallization lines and features. For instance, as shown in FIG. 2B, the overburden portion of the copper layer 206 and the diffusion barrier layer 204 have been removed. A side effect of improper endpoint detection or over-polishing is that dishing 208 occurs over the metallization layer that is desired to remain within the dielectric layer 202. The dishing effect essentially removes more metallization material than desired and leaves a dish-like feature 208 over the metallization lines. Dishing is known to impact the performance of the interconnect metallization lines in a negative way, and too much dishing can cause a desired integrated circuit to fail for its intended purpose.

Prior art endpoint detection methods typically, can only approximately predict the actual end point but cannot actually detect the actual endpoint. This approximate prediction increases the likelihood of excess dishing occurring. As a result, the endpoint detection is set to a conservative point resulting in wafers that have still residual areas and portions of metallization layer 206 that must be quantified and removed and in a rework process. Rework processing is extremely costly and inefficient processing. Further, reworked wafers are no longer a standard production product but rather become special products and as such can incorrectly skew quality and reliability results of the production process.

FIG. 3A is a flowchart of a typical CMP process 300 including the rework of the wafers. In operation 302 the wafer 104 is loaded into the conventional linear wafer polishing apparatus 100 (CMP process tool) such as through a loading chamber or port or other entry to the CMP process tool 100.

In operation 304, the wafer 104 is mounted into the polishing head 108 typically by a robot arm. In operation 306 the wafer 104 is planarized as described above until an endpoint is detected in operation 308. The endpoint can be detected by any of a number of prior art methods such as a specific planarization duration or an optical analysis of the wafer through an endpoint detection window in the polishing pad 102 or other methods.

Once the endpoint has been detected, the wafer 104 is removed from the polishing head 108 in operation 310. In operation 312, the wafer is removed from the CMP process tool 100 and transferred to an inspection station where the wafer 104 can be inspected in operation 314. Inspecting the wafer 104 typically includes examining the wafer 104 to determine if any film residues remain. If any film residues remain, the thickness of the film residues must be determined. Once the thickness of any film residue is determined, then a rework process can be developed for the specific rework needs of the wafer 104, in operation 322. The specific rework process is individual to each wafer 104 because the thickness of the film residue on each wafer may be different. In operation 324 the CMP process tool can be programmed to perform the wafer-specific rework process and the wafer 104 can be reworked through the CMP process tool (or a separate CMP process tool) as described above in operations 302–320. If all of the desired material has been removed (i.e., no residual films remain on the surface of the wafer 104), in operation 320, the CMP process is complete and the CMP process ends.

While the prior art process 300 described above purported to detect a CMP endpoint, the actual endpoint for each planarized wafer was not actually detected until after the wafer was removed from the CMP process tool and inspected at an inspection station in operation 314 and no residual films were found to remain on the surface of the wafer 104. Detecting the actual endpoint for each wafer outside of the CMP process tool results in additional handling, a longer and more complex CMP process, and potentially requiring multiple passes by each wafer through the CMP process tool to achieve the desired planarizing results. Further, conventional rework processes results in non-standard product as described above.

In view of the foregoing, there is a need for accurately determining and mapping any residual metal film remaining on the surface of the wafer integral within the CMP process tool.

SUMMARY OF THE INVENTION

Broadly speaking, the present invention fills these needs by providing a system and method for detecting and mapping a metallic layer within sequence of a multi-step process. It should be appreciated that the present invention can be implemented in numerous ways, including as a process, an apparatus, a system, computer readable media, or a device. Several inventive embodiments of the present invention are described below.

One embodiment includes a system and method of detecting metallic residue on a wafer within a CMP tool includes polishing a surface of a wafer with a polishing pad to substantially remove a metal layer. Moving the wafer away from the polishing pad. Positioning at least one sensor a predetermined distance from the surface of the wafer. Mapping the surface of the wafer to determine if a metallic residue remains on the surface of the wafer.

If metallic residue remains on the surface of the wafer then a location and a thickness of the metallic residue is determined and the polishing pad is again applied to the surface of the wafer to substantially remove the metallic residue without removing the wafer from the CMP process tool.

In one embodiment the at least one sensor includes at least one eddy current sensor.

In one embodiment at least one CMP tool operating parameter can be modified according to at least one of a location and a thickness of the metallic residue so as to optimize a subsequent CMP process on a subsequent wafer.

Applying the polishing pad to the surface of the wafer to substantially remove the metallic residue can also include modifying at least one CMP tool operating parameter according to at least one of a location and a thickness of the metallic residue to optimize the removal of the metallic residue on the wafer.

In one embodiment positioning can include aligning on at least two points on the wafer carrier. Positioning can also include moving the sensor in a radial motion and/or a linear motion.

In one embodiment mapping can include moving at least one of the wafer carrier and the at least one sensor. Mapping can also include scanning the entire surface of the wafer with the at least one sensor determining a thickness of the metallic residue that corresponds to an amplitude of a mapping signal.

The predetermined distance can be determined by at least one distance sensor.

In one embodiment a permalloy layer can be included between the wafer and the wafer carrier. The permalloy layer can have a thickness greater than a skin depth.

In one embodiment a system for processing a substrate includes a movable substrate carrier. The substrate carrier can support the substrate during processing operations. At least one sensor that can be placed in parallel with and at a predetermined distance from a processed surface of the substrate. The at least one sensor capable of detecting a metallic layer on the processed surface of the substrate.

The at least one sensor includes at least one eddy current sensor. Alternative embodiments can include multiple eddy current sensors.

A distance sensor can be included for detecting the predetermined distance.

One embodiment includes a sensor carrier that is configured to support the at least one sensor. The sensor carrier is capable of being aligned with the substrate carrier at at least one point to determine the predetermined distance.

In one embodiment, the system for processing a substrate can include a chemical mechanical planarization (CMP) tool.

In one embodiment, the system for processing a substrate can include a system controller capable of controlling at least one process parameter and is also in communication with the at least one sensor.

One embodiment includes a chemical mechanical planarization (CMP) tool that includes a movable wafer carrier defined within a housing, the wafer carrier being configured to support a wafer during CMP operations. At least one eddy current sensor located such that the at least one eddy current sensor can be placed in parallel with and at a predetermined distance from a planarized surface of the wafer. The at least one eddy current sensor capable of detecting a metallic residue on the planarized surface of the wafer. A permalloy layer is located between the wafer and the wafer carrier.

One embodiment includes a system and method of measuring a metallic layer on a substrate within a multi-step substrate process includes modifying a metallic layer on the substrate such as forming a metallic layer or removing at least a portion of the metallic layer. At least one sensor is positioned a predetermined distance from the surface of the substrate. The surface of the substrate is mapped to determine a uniformity of the metallic layer on the surface of the substrate.

The disclosed invention provides the advantage of completing all rework as part of and within sequence of a multi-step process without having to remove the substrate or wafer from the process tool for an external inspection process. This increases efficiency of the multi-step process while also reducing the handling and rework time required for each wafer and also results in a standard production process product rather than a non-standard, customized process product.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 2A and 2B show a cross-sectional view of a dielectric layer on a wafer that is undergoing a fabrication process that is common in constructing damascene and dual damascene interconnect metallization lines.

DETAILED DESCRIPTION OF THE EXEMPLARY EMBODIMENTS

Several exemplary embodiments for detecting and mapping metal residue within the CMP sequence will now be described. It will be apparent to those skilled in the art that the present invention may be practiced without some or all of the specific details set forth herein.

As described above, the prior art CMP process only actually determined whether or not the CMP process had fully removed the desired quantity of materials after the wafer was finished and was removed from the CMP process tool, in a subsequent inspection process. One embodiment of the present invention is an improved method and apparatus that can perform the inspection sub-process within the CMP sequence, while the wafer 104 remains secured in the polishing head 108. Performing the inspection sub-process within the CMP sequence reduces the number of times the wafer 104 must be mounted to the polishing head 108 to only one time and reduces the overall wafer handling and inspection sub-processes. This substantially eliminates rework for a wafer that did not have the desired material removed from the wafer, the first time the wafer was mounted to the polishing head.

Figure 3A:
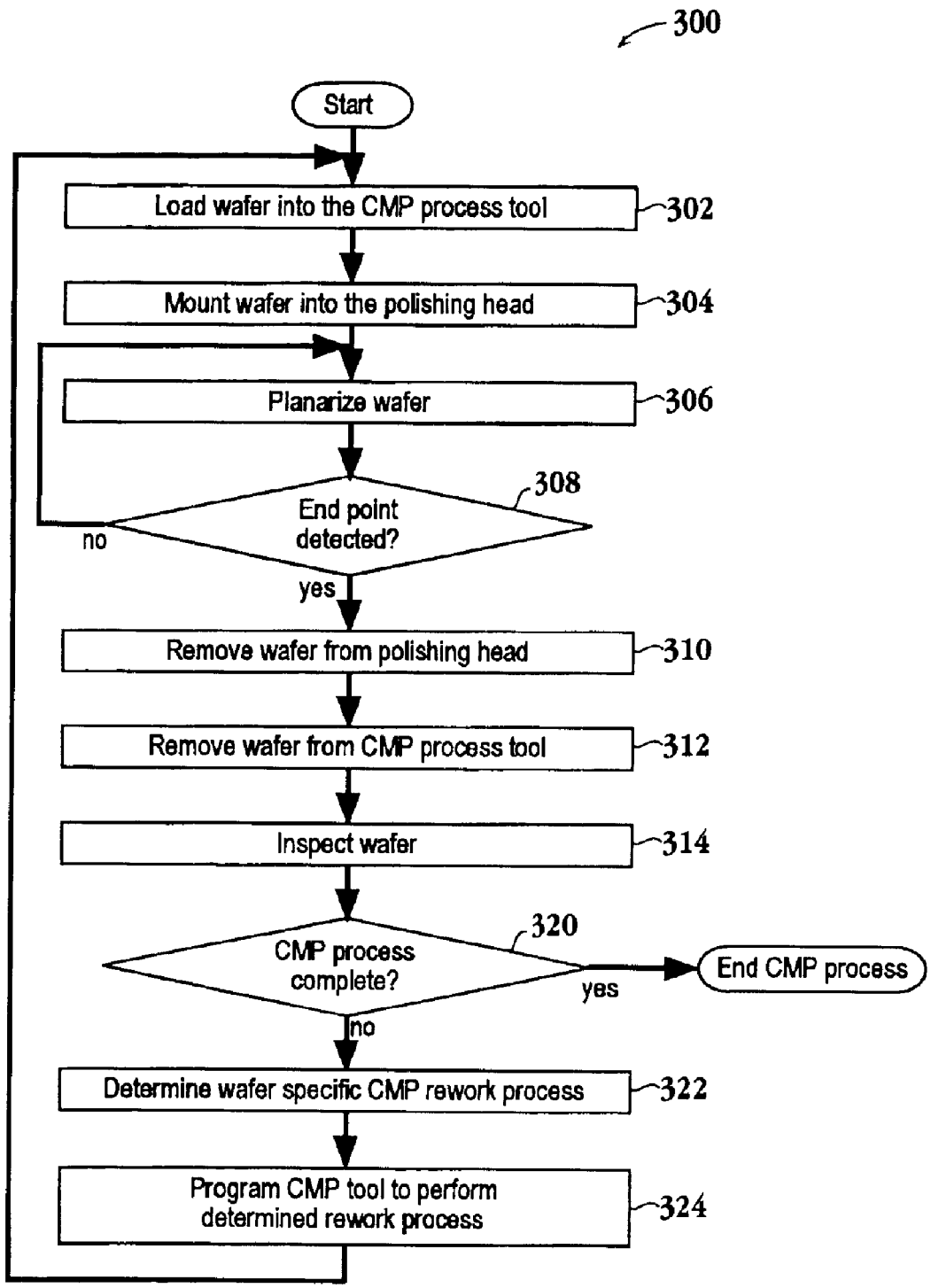
FIG. 3A is a flowchart of a typical CMP process including the rework of the wafers.
Figure 3B:
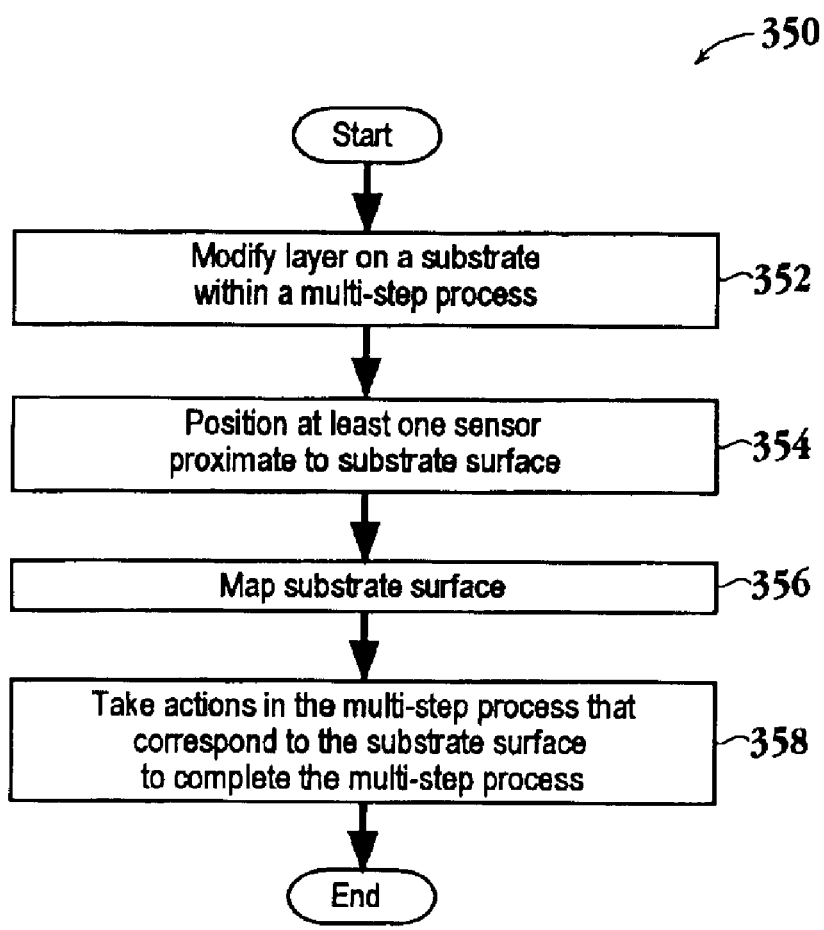
FIG. 3B is a flowchart diagram that illustrates the method operations performed in detecting and mapping metal layer within the sequence of a multi-step process in accordance with one embodiment of the present invention.

FIG. 3B is a flowchart diagram that illustrates the method operations 350 performed in detecting and mapping metal layer within the sequence of a multi-step process in accordance with one embodiment of the present invention. In operation 352, a metallic layer on the substrate is modified such as forming the metallic layer (e.g., in a plating or deposition process) or removing at least a portion of the metallic layer (e.g., in an etching or planarizing process).

In operation 354, at least one sensor is positioned a predetermined distance from the surface of the substrate. The sensor can be positioned in any one of a number of methods as will be described in more detail below. The predetermined distance can be determined in any one of a number of methods as will be described in more detail below.

In operation 356, the surface of the substrate is mapped such as to determine a uniformity of the metallic layer on the surface of the substrate.

In operation 358, the multi-step process is continued to completion. One or more of the steps in the multi-step process may be modified within the process as necessary to correct or not correct any non-uniformities found in the metallic layer on the surface of the substrate, as will be described in more detail below.

Figure 4:
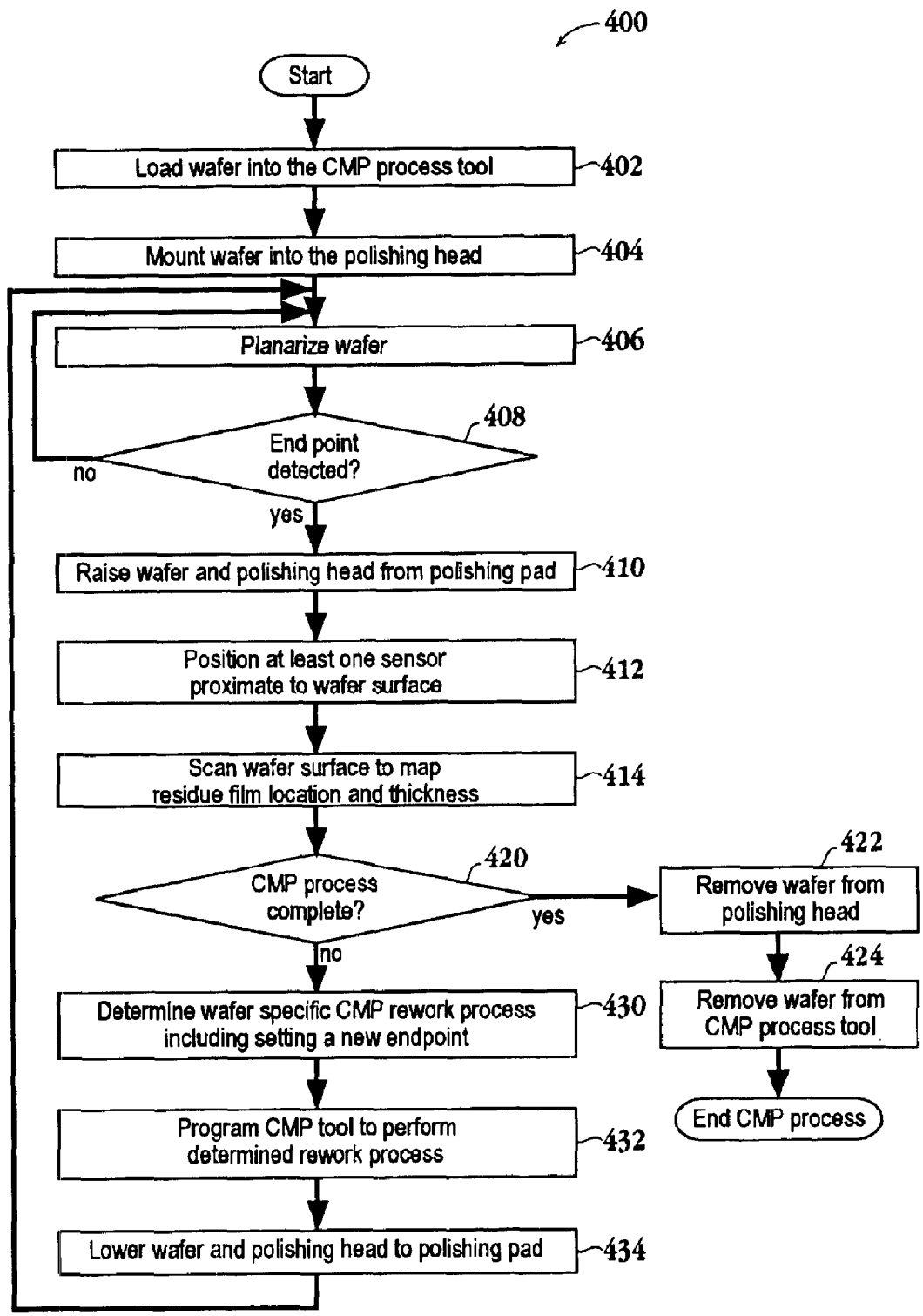
FIG. 4 is a flowchart diagram that illustrates the method operations performed in detecting and mapping metal residue within the CMP sequence in accordance with one embodiment of the present invention.

FIG. 4 is a flowchart diagram that illustrates the method operations 400 performed in detecting and mapping metal residue within the CMP sequence in accordance with one embodiment of the present invention. In operation 402 the wafer 104 is loaded into a CMP process tool 500 such as described below in FIG. 5B. The wafer 104 is then mounted to a polishing head 108. The CMP process tool is also pre-programmed to perform an original or base set of CMP process variables as are required by the operator to perform the desired CMP operation on the wafer 104.

In operation 406, the wafer 104 is planarized by applying the polishing pad 102 to the surface of the wafer 104. The wafer 104 can be placed in contact with the polishing pad 102 through any one of a number of ways that are well-known in the art. In one embodiment, the polishing head 108 is lowered to the polishing pad 102. In an embodiment, the polishing head 108 can be moved between a wafer mounting position and a wafer polishing position.

The wafer 104 is planarized until an endpoint is detected in operation 408. The endpoint can be detected through any number of systems and methods that are well known in the art.

When the endpoint is detected, the wafer 104 is moved away from the polishing pad 102 in operation 410. The wafer 104 can be moved away from the polishing pad 102 in any manner, such as by lifting the wafer above the polishing pad 102. Alternatively, the polishing pad 102 can be moved away from the wafer 104. The wafer 104 can also be moved more than just lifted such as lifted up and rotated away from the polishing pad 102.

In operation 412, one or more sensors are placed in position so that the sensors can effectively evaluate the surface of the wafer 104. In one embodiment, the wafer is moved to the sensor(s). Alternatively, the sensor(s) can be moved to the wafer or combinations of moving both the wafer 104 and the sensor(s). The sensor can be an eddy current sensor or multiple eddy current sensors such as described in commonly owned U.S. patent application Ser. No. 10/186,932, which is entitled "Method and Apparatus of Arrayed Sensors for Metrological Control" which is incorporated by reference herein for all purposes.

In one embodiment the eddy current sensor(s) are moved to a close proximity of the surface of the wafer 104, in operation 412. The polishing head 108 can also include alignment devices that precisely align and locate the sensor(s) relative to the surface of the wafer 104.

In operation 414, once the sensor(s) and the wafer 104 are in close proximity, the sensor(s) can scan the surface of the wafer 104 to create a precise map of the location and thickness of any film residues that may remain on the surface of the wafer. If, in operation 414 no film residues are detected on the surface of the wafer 104, then in operation 420 the CMP process is complete and the method operations continue in operation 422.

In operation 422 the wafer is then removed from the polishing head 108 so that the wafer can be removed from the CMP process tool in operation 424 and the CMP method operations end.

If, in operation 414, film residues are detected on the surface of the wafer 102, then the CMP process is not complete and the method operations continue in operation 430. In operation 430, the specific details of the location and thickness of the detected film residue(s) are used to determine the precise CMP processes (i.e., in-sequence rework requirements) that are required to remove the detected film residues.

Figure 5A:
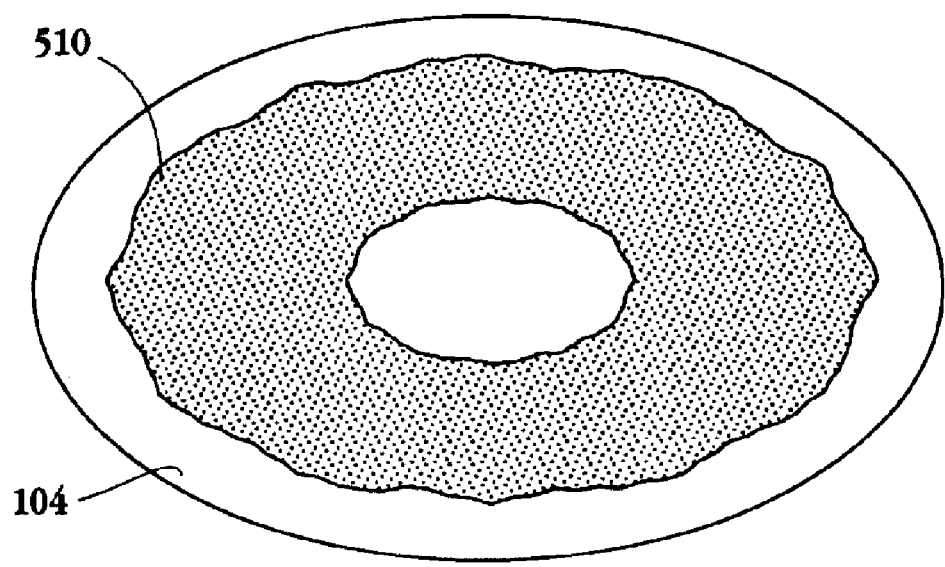
FIG. 5A shows a residue film on the surface of the wafer, which was detected in FIG. 4 above.

In operation 432, the CMP process tool is "programmed" or instructed to perform the in-sequence rework corrective actions. For example, FIG. 5A shows a residue film 510 on the surface of the wafer 104, which was detected in operation 414. Also in operation 414, the thickness of the residue 510 was found to be 200 angstroms. Then, in operation 430, the CMP process variables such as time, pressure, location of the pressure, polishing pad velocity, endpoint detection, slurry flowrate, and slurry type and other CMP variables to be applied to the wafer 102 that are required to remove the residue 510 are determined. These variables make up the in-sequence rework requirements that are then input into the CMP process tool in operation 432.

In operation 434, the wafer 104 is again placed in contact with the polishing pad to perform the in-sequence rework and the method operations repeat beginning with operation 406 as described above. In one embodiment, in-sequence rework requirements also includes a new endpoint or alternatively a different endpoint detection method and apparatus.

In one embodiment, the original CMP process variable set points may be reset before beginning applying them to a subsequent wafer. In one embodiment, the original CMP process variable set points can be automatically adjusted or refined according to the in-sequence rework requirements. For example, if in a first wafer the detected endpoint was found in operation 430 to be five seconds too early, then for a subsequent wafer the endpoint is extended such as by five seconds or a portion thereof.

As described above in FIG. 4, the in-sequence rework decreases the number of times each wafer must be handled and therefore decreases the opportunities for handling errors to occur. Further, performing the necessary rework within the sequence of the CMP process rather than externally from the CMP process decreases the total time required to perform the complete CMP process on each wafer, thereby improving wafer throughput.

Figure 1:
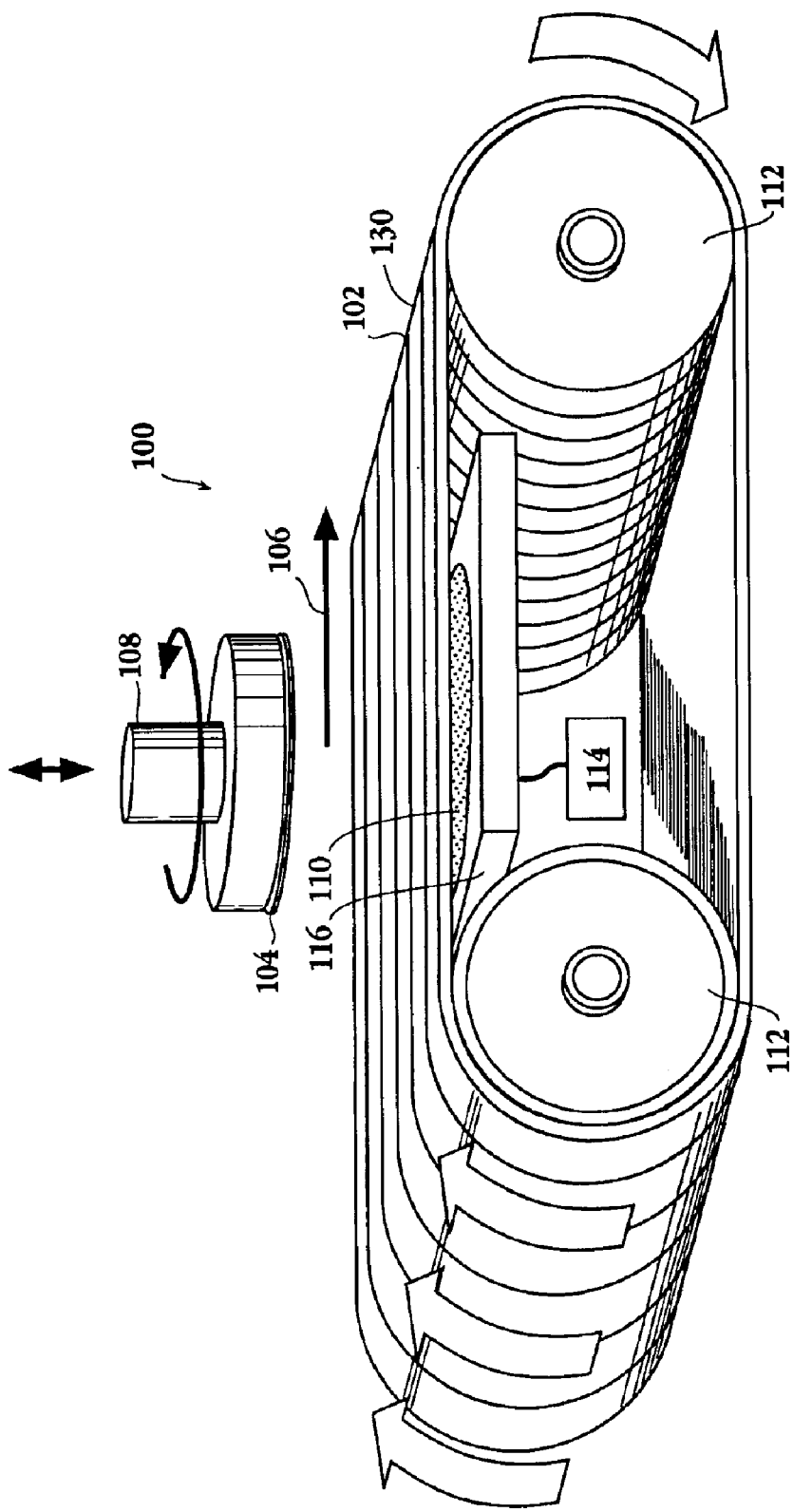
FIG. 1 shows a side view of a conventional linear wafer polishing apparatus.
Figure 5B:
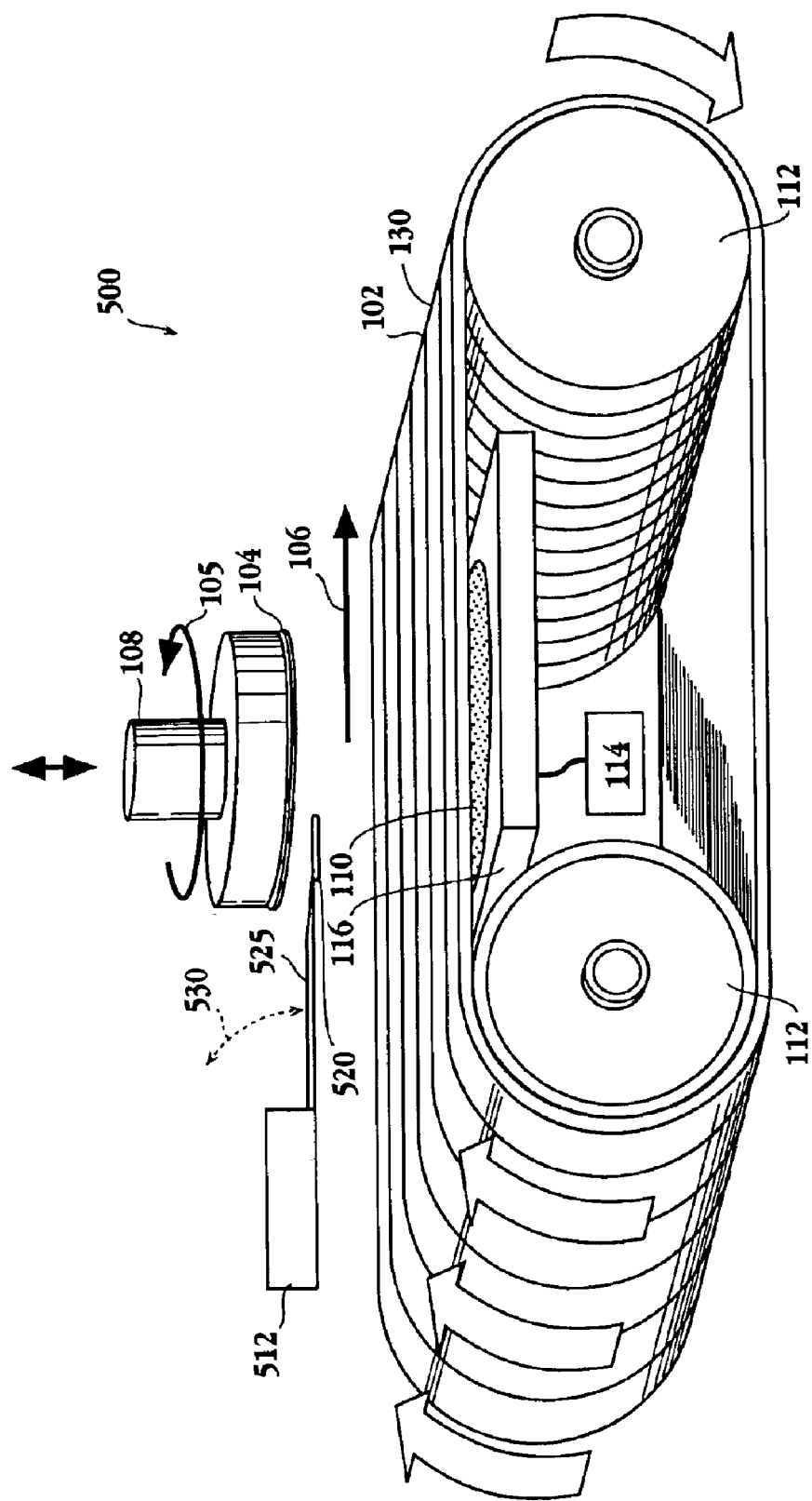
FIG. 5B shows a side view of a linear wafer polishing apparatus in accordance with one embodiment of the present invention.

FIG. 5B shows a side view of a linear wafer polishing apparatus 500 in accordance with one embodiment of the present invention. The linear wafer polishing apparatus 500 is similar to the linear wafer polishing apparatus 100 of FIG. 1 except that a sensor 520 is also included. The sensor 520 is mounted on an arm 525 that is capable of rotating through an angular range 530 about a base 512. As described above, in operation 412, the sensor 520 can be rotated into position near the surface of the wafer 104.

Figure 5C:
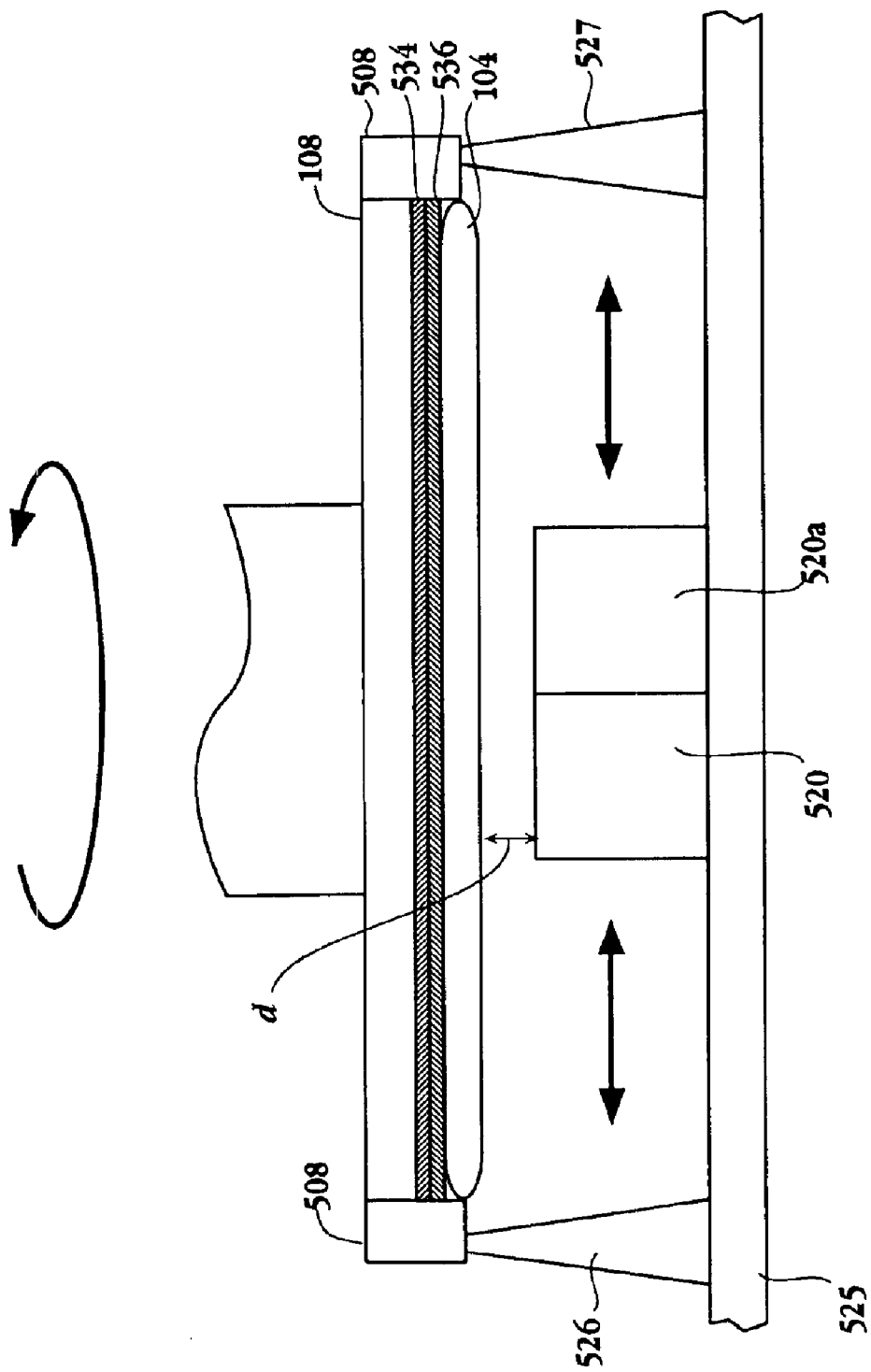
FIG. 5C shows a detailed cutaway view of the sensor in position relative to the surface of the wafer and the polishing head in accordance with one embodiment o the present invention.

FIG. 5C shows a detailed cutaway view of the sensor 520 in position relative to the surface of the wafer 104 and the polishing head 108 in accordance with one embodiment o the present invention. The polishing head 108 includes a retaining ring 508 that holds the wafer 104. One or more cushioning layers or backing plates 534, 536 can also be included. The sensor 520 can be precisely located relative to the surface of the wafer 104 by one or more locating pins 526, 527. Alternatively a distance sensor 520A can be used to locate the sensor 520 the desired distance d from the surface of the wafer 104. Distance sensor 520A and one or more locating pins 526, 527 can also be used in combination. In one embodiment the desired distance d is between a range of about 3 millimeters to about 6 millimeters.

The sensor 520 can be moved horizontally relative to the surface of the wafer 104 while the polishing head 108 rotates the wafer 104 so that the sensor can scan the entire surface of the wafer 104. Using mechanical locating means such as stepper motors and the like, the precise location of any detected residue can be recorded.

In one embodiment, the sensor 520 includes one or more eddy current sensors. Eddy current sensors produce an electromagnetic field. When a conductor, such as a metallic residue film 510, enters the electromagnetic field, the electromagnetic field is perturbed. The eddy current sensor 520 can be calibrated such that a given thickness and area of a residue film will perturb the electromagnetic field in a known manner therefore the eddy current sensor is able to map the entire surface of the wafer.

The current signal M detected by an eddy current sensor 520 is proportional to the thickness of the conductive film residue 510A and the distance d between the eddy current sensor 520 and the conductive film residue 510A. This relationship can be expressed in the following Formula 1:

$$M=K(d)(\text{thickness})$$

Where K is a constant that is a function of the medium that the electromagnetic field is flowing through (i.e., ambient atmosphere, silicon of the wafer 104, stainless steel of the polishing head 108, etc.).

Figure 6A:
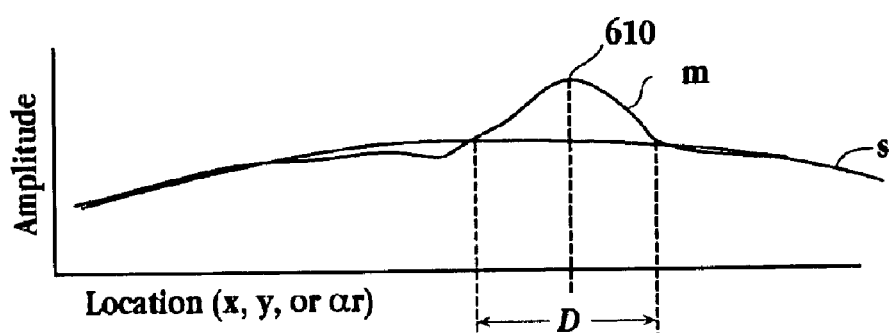
FIG. 6A is a graph of the eddy currents as sensed by the eddy current sensor.

FIG. 6A is a graph of the eddy currents as sensed by the eddy current sensor 520. Curve M is the raw mapping data shown in amplitude on the vertical axis and location in the horizontal axis. The peak 610 in curve M correspond to the location of a residual film spot on the surface of the wafer 104. The location can be measured in any manner such as an X-Y grid superimposed over the surface of the wafer 104 or an $\alpha$-r coordinate system where $\alpha$ is an angle of rotation of the wafer 104 and r is a radius out for the center of the wafer 104. Curve S is a long range smoothing of curve M. Any long range smoothing technique can be used. Curve S can also represent a baseline that may be based on a completed wafer with out any residual film spots.

Figure 6B:
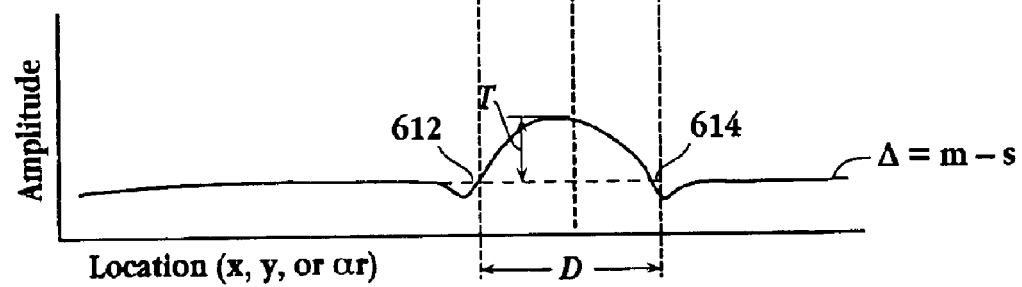
FIG. 6B is a graph of the difference between the smoothed mapping data S from the mapping data M.

FIG. 6B is a graph of the difference between the smoothed mapping data curve S from the mapping data M. The difference result is a curve $\Delta$. The peak in the curve $\Delta$ correspond to the location of the residual film spot on the surface of the wafer 104. The amplitude of the peaks in the curve $\Delta$ correspond to the thickness T of the residual film spots on the surface of the wafer 104. The width D of the film spot can be sufficiently approximated as the point 612, 614, where the curve $\Delta$ dips below a zero reference.

Figure 6C:
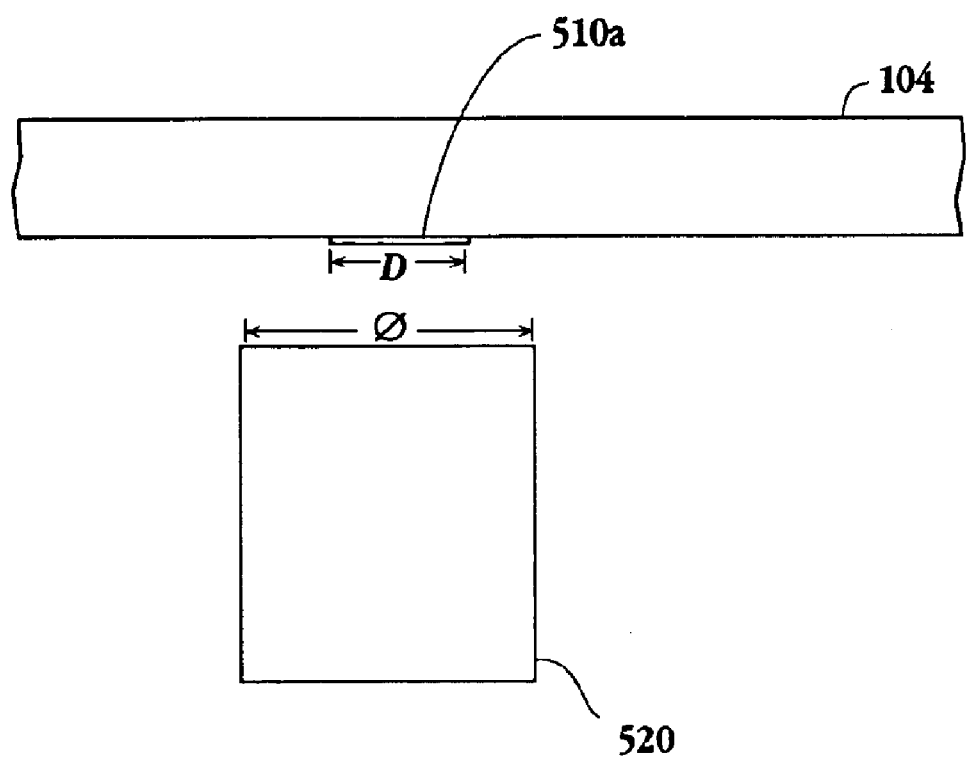
FIG. 6C shows a detailed view of an eddy current sensor 520 and a surface of the wafer 104 in accordance with one embodiment of the present invention.

FIG. 6C shows a detailed view of an eddy current sensor 520 and a surface of the wafer 104 in accordance with one embodiment of the present invention. If the diameter $\Phi$ of the eddy current sensor 520 is greater than the width D of the residual film spot 510A, then the resulting residual thickness may be somewhat underestimated. To correct for this, the detected eddy current signal is multiplied by the correction ratio of the width D and the diameter $\Phi$ to produce a corrected signal that more accurately corresponds with an actual thickness of the residual film spot 510A. In one embodiment, the correction ratio is: $(D/\Phi)^2$. Alternatively, the correction ratio can be about $(D/\Phi)^2$.

Once the surface of the wafer is mapped a three dimensional representation of the surface can be constructed which will identify the location width and thickness of the residual film spots such as film spot 520A.

However, as the thickness of the residual film becomes less and less, the peaks in the curve $\Delta$ become correspondingly smaller and smaller and approach the level of the low-level background noise. The result is that thinner films can be more difficult to differentiate from the low-level background noise in some instances.

In one embodiment a layer or plate of a ferromagnetic or a paramagnetic material is included between the wafer 104 and the polishing head 108. In one embodiment the layer 534 can be a ferromagnetic or a paramagnetic material such as permalloy. The layer 534 can be a separate plate between the wafer 104 and the polishing head 108 or a layer formed on the surface of the polishing head 108. The layer 534 should be at least skin depth or greater in thickness. In one embodiment, the layer 534 can be a about 0.5 mm or greater thickness. Ferromagnetic and paramagnetic material has the physical characteristic of amplifying magnetic fields such as the electromagnetic field produced by the eddy current sensor 520. As a result, a thinner layer of the residual film spot 510A can result in a higher peak in the detected signal without the ferromagnetic or a paramagnetic material.

The use of ferromagnetic or a paramagnetic material to increase a signal detected by an eddy current sensor or multiple eddy current sensors is more fully described in commonly owned U.S. patent application Ser. No. 10/256,055 filed on Sep. 25, 2002, which is entitled "Enhancement of Eddy Current Based Thin Film Thickness Measurement Capabilities" which is incorporated by reference herein for all purposes.

Figure 7:
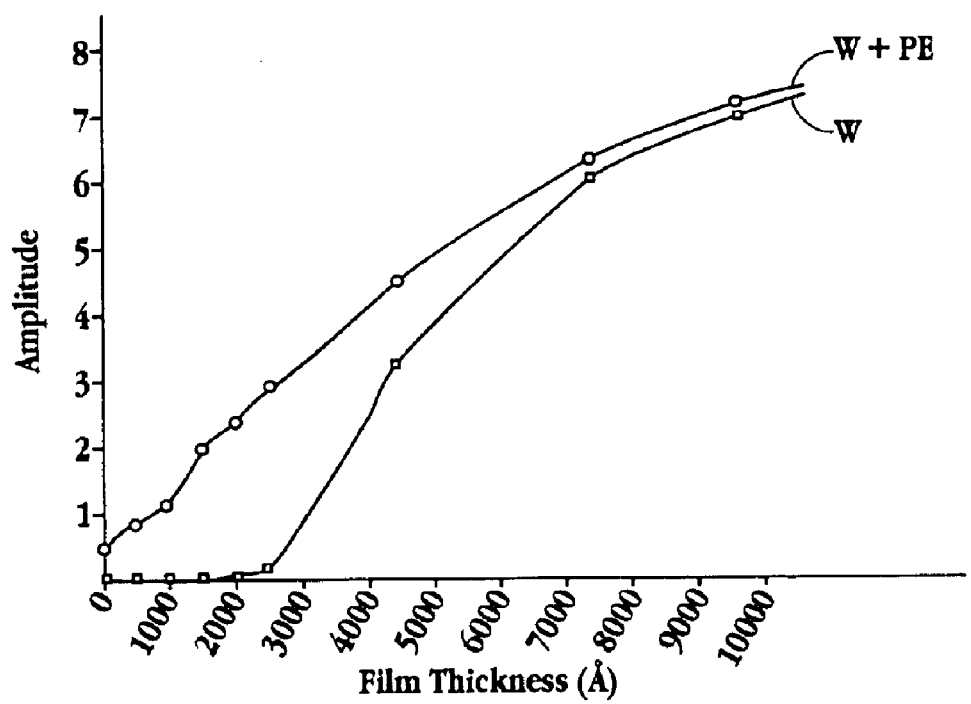
FIG. 7 shows a graph 700 of the amplifying effects of a permalloy layer 534 in accordance with one embodiment of the present invention.

FIG. 7 shows a graph 700 of the amplifying effects of a permalloy layer 534 in accordance with one embodiment of the present invention. Permalloy is a nickel and iron alloy that has a high magnetic permeability (i.e. a paramagnetic material) that is commonly used for electromagnetic shielding. Curve W represents an eddy current sensor scan of a wafer without any material backing it. Curve W+PE represents a scan of the same wafer with a permalloy layer 534 behind the wafer. As can be seen, the thinner residue films (i.e. below 2500 angstroms) result in a very slight amplitude of signal for the wafer alone (i.e., curve W). Curve W+PE shows the amplitude of the returned signal to be many multitudes greater with the permalloy layer 534 behind the wafer. As a result the permalloy allows accurate detection of much thinner residue films. Through testing the amplitude of the returned signal can be calibrated to a corresponding thickness of the residue film.

In one embodiment the system determines the thickest residual film 510A and calculates the correct amount of CMP polishing time and other parameters required to remove that thickness. The wafer is then polished according to the determined parameters. Alternatively, the thickness of the residual film 510 can be determined in various locations and various CMP parameters can be set to remove the different amounts of material in the different locations.

While the invention has been described in terms of being used within a CMP process, the invention is not limited to use within a CMP process. In another embodiment, the present invention can be used to measure the thickness and/or uniformity of a layer within any process such as physical vapor deposition (PVD), chemical vapor deposition (CVD), plating processes (e.g., such as metallic plating such as aluminum, copper, diffusion barrier, etc.), providing a conductive layer within packaging or other processes where conductive layer non-uniformities and or thickness need to be monitored.

By way of example, the a movable sensor can be included within a PVD process tool, either within the PVD process chamber or within the wafer loading and handling portions of the PVD process tool such as mounted on an end effector of a wafer handling system. When a layer is deposited on the wafer, the sensor can scan the surface of the wafer to determine if the deposited layer is the desired thickness (e.g., the desired thickness of an overburden layer) and also identify any pin holes in the deposited layer, or other non-uniformities and defects in the layer. If additional material is necessary to meet the desired layer thickness or to fill pin holes or other non-uniformities, then additional material can be immediately deposited on the wafer because the wafer is still within the PVD process tool and without removing the wafer from the PVD process tool for an external layer inspection.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Certain aspects of the invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CDRs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in FIG. 4 are not required to be performed in the order illustrated, and that all the processing represented by the operations may not be necessary to practice the invention. Further, the processes described in FIGS. 4 can also be implemented in software stored in any one of or combinations of a computer memory such as RAM, ROM, or a hard disk drive.

As used herein the term "about" means +/−10%. By way of example, the phrase "about 250" indicates a range of between 225 and 275.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of detecting metallic residue on wafer within a CMP tool comprising:

applying a polishing pad to a surface of a wafer to substantially remove a metal layer;

moving the wafer away from the polishing pad;

providing a paramagnetic layer between the wafer and a wafer carrier;

positioning at least one sensor a predetermined distance from the surface of the wafer; and mapping the surface of the wafer to determine if a metallic residue remains on the surface of the wafer, wherein if metallic residue remains on the surface of the wafer then:

determining a location and a thickness of the metallic residue; and applying the polishing pad to the surface of the wafer to substantially remove the metallic residue.

2. The method of claim 1, wherein the at least one sensor includes at least one eddy current sensor.

3. The method of claim 1, further comprising modifying at least one CMP tool operating parameter according to at least one of a location and a thickness of the metallic residue so as to optimize a subsequent CMP process on a subsequent wafer.

4. The method of claim 1, wherein applying the polishing pad to the surface of the wafer to substantially remove the metallic residue includes modifying at least one CMP tool operating parameter according to at least one of a location and a thickness of the metallic residue to optimize the removal of the metallic residue on the wafer.

5. The method of claim 1, wherein positioning includes aligning on at least two points on the wafer carrier.

6. The method of claim 1, wherein positioning includes moving the sensor in a radial motion.

7. The method of claim 1, wherein positioning includes moving the sensor in a linear motion.

8. The method of claim 1, wherein mapping includes moving at least one of the wafer carrier and the at least one sensor.

9. The method of claim 1, wherein the predetermined distance is determined by at least one distance sensor.

10. The method of claim 1, wherein providing a paramagnetic layer between the wafer and the wafer carrier includes providing a permalloy layer between the wafer and the wafer carrier.

11. The method of claim 1, wherein mapping can include scanning the entire surface of the wafer with the at least one sensor; and determining a thickness of the metallic residue that corresponds to an amplitude of a mapping signal.

12. A system for processing a substrate, comprising:

a movable substrate carrier, the substrate carrier capable of supporting the substrate in a first position during processing operations and capable of supporting the substrate in a second position for detecting a metallic layer on a processed surface of the substrate;

a paramagnetic layer between the substrate and the substrate carrier;

at least one sensor that can be placed in parallel with and at a predetermined distance from the processed surface of the substrate in the second position the at least one sensor capable of detecting a location and a thickness of the metallic layer on the processed surface of the substrate; and a system controller capable of controlling at least one process parameter and which is in communication with the at least one sensor and wherein in response to the at least one sensor detecting the location and the thickness of metallic layer on the surface of the substrate then the movable substrate carrier is capable of returning the substrate to the first position and the system controller is capable of modifying at least one process parameter.

13. The system of claim 12, wherein the at least one sensor includes at least one eddy current sensor.

14. The system of claim 12, wherein the paramagnetic layer includes a permalloy layer located between the substrate and the substrate carrier.

15. The system of claim 12, wherein the paramagnetic layer has a thickness greater than a skin depth.

16. The system of claim 12, further comprising a distance sensor capable of detecting the predetermined distance.

17. The system of claim 12, the at least one sensor is movable and is capable of scanning substantially the entire processed surface of the substrate.

18. The system of claim 12, wherein the at least one sensor is movable in a radial motion.

19. The system of claim 12, further comprising a sensor carrier that is configured to support the at least one sensor, the sensor carrier being capable of being aligned with the substrate carrier at at least one point to determine the predetermined distance.

20. The system of claim 12, wherein the system for processing a substrate includes a chemical mechanical planarization (CMP) tool, and wherein the substrate includes a wafer.

21. A chemical mechanical planarization (CMP) tool comprising:

a movable wafer carrier defined within a housing, the wafer carrier configured to support a wafer during CMP operations;

at least one eddy current sensor located such that the at least one eddy current sensor can be placed in parallel with and at a predetermined distance from a planarized surface of the wafer, the at least one eddy current sensor capable of detecting a metallic residue on the planarized surface of the wafer; and a permalloy layer located between the wafer and the wafer carrier.

22. A method of measuring a metallic layer on substrate within a multi-step substrate process comprising:

modifying a metallic layer on the substrate, the substrate being supported in a first position wherein a paramagnetic layer is provided between the substrate and a substrate carrier;

moving the substrate to a second position;

positioning at least one sensor a predetermined distance from the surface of the substrate, the substrate being supported in the second position;

mapping the surface of the substrate to determine a uniformity of the metallic layer on the surface of the substrate; and further modifying the metallic layer on the surface of the substrate corresponding to the determined uniformity of the metallic layer.

23. The method of claim 22, wherein modifying the metallic layer on the substrate includes forming the metallic layer on the substrate.

24. The method of claim 22, wherein modifying the metallic layer on the substrate includes removing at least a portion of the metallic layer from the substrate.

* * * * *